(12) United States Patent
Lam et al.

(10) Patent No.: US 11,397,445 B1
(45) Date of Patent: Jul. 26, 2022

(54) RADIATION TOLERANT DISCRETE REFERENCE FOR DC-DC CONVERTERS

(71) Applicant: Crane Electronics, Inc., Lynnwood, WA (US)

(72) Inventors: Cuon Lam, Renton, WA (US); Sovann Song, Kent, WA (US)

(73) Assignee: Crane Electronics, Inc., Lynnwood, WA (US)

( * ) Notice: Subject to any disclaimer, the term of this patent is extended or adjusted under 35 U.S.C. 154(b) by 0 days.

(21) Appl. No.: 17/466,866

(22) Filed: Sep. 3, 2021

(51) Int. Cl.
| | |
|---|---|
| *G05F 3/18* | (2006.01) |
| *H02M 3/04* | (2006.01) |
| *H03K 17/60* | (2006.01) |
| *H02M 1/00* | (2006.01) |
| *H02M 1/08* | (2006.01) |

(52) U.S. Cl.
CPC ............ *G05F 3/18* (2013.01); *H02M 1/0003* (2021.05); *H02M 1/08* (2013.01); *H02M 3/04* (2013.01); *H03K 17/60* (2013.01)

(58) Field of Classification Search
CPC ......... G05F 3/18; H02M 1/0003; H02M 1/08; H02M 3/04; H03K 17/60
See application file for complete search history.

(56) References Cited

U.S. PATENT DOCUMENTS

| | | | | |
|---|---|---|---|---|
| 5,621,307 | A | * | 4/1997 | Beggs ....................... G05F 3/18 323/907 |
| 7,095,282 | B2 | * | 8/2006 | Barabash .................. G05F 3/18 330/296 |
| 7,477,096 | B2 | | 1/2009 | Summer |
| 7,635,970 | B2 | | 12/2009 | Summer |
| 9,887,014 | B2 | | 2/2018 | Zanchi et al. |
| 10,355,579 | B2 | | 7/2019 | Summer |
| 2011/0260707 | A1 | * | 10/2011 | Imanishi ................. H02M 1/08 323/311 |
| 2018/0048232 | A1 | | 2/2018 | Adell et al. |

* cited by examiner

*Primary Examiner* — Kyle J Moody
(74) *Attorney, Agent, or Firm* — Seed Intellectual Property Law Group LLP

(57) ABSTRACT

A radiation tolerant discrete reference voltage source includes just two bipolar junction transistors, five resistors, and a Zener diode. Two of the resistors form a voltage divider that outputs a reference voltage. Values of the resistors included in the voltage divider can be selected to output a desired reference voltage level, for example, 5.00V, 4.00V, or 2.50V, which obviates a need to procure unique voltage references for those reference voltage levels and provides design flexibility. The radiation tolerant discrete reference voltage source provides improved control over radiation hardness and does not require high gain transistors. Because relatively few, inexpensive components are used, the radiation tolerant discrete reference voltage source can be produced at a low cost.

20 Claims, 5 Drawing Sheets

RADIATION TOLERANT DISCRETE REFERENCE FOR DC-DC CONVERTERS

BACKGROUND

Technical Field

The present disclosure relates to power converters, and more particularly to radiation tolerant discrete reference voltage sources for direct current (DC) to DC power converters.

Description of the Related Art

A radiation hardened integrated reference voltage source is typically much more expensive compared to a non-radiation hardened equivalent. For example, a radiation hardened integrated reference voltage source is typically an integrated bandgap device, such as an LT1009 integrated reference circuit or an LM136 reference diode, which are provided by from Texas Instruments. The LT1009 integrated reference circuit and the LM136 reference diode may cost $180 and $160, respectively. A non-radiation hardened equivalent of each part may cost less than $5. Accordingly, it is desirable to provide radiation hardened integrated reference voltage sources having a lower cost.

BRIEF SUMMARY

The present disclosure provides a discrete voltage reference source using discrete bipolar junction transistors. Embodiments of the disclosure may use only discrete resistors, a Zener diode, and two transistors to achieve very high precision and radiation tolerance up to 300 krad(Si) with less than 1% change in voltage. Discrete voltage reference sources according to the present disclosure may be used in power conversion for printed circuit boards (PCBs) and hybrid DC-DC converters applications, for example.

A radiation tolerant discrete reference voltage source according to the present disclosure may be characterized as including: an input terminal which, in operation, inputs an input signal provided by an external voltage source; an output terminal which, in operation, outputs an output signal from the radiation tolerant discrete reference voltage source; a first resistor including a first terminal and a second terminal, wherein the first terminal of the first resistor is electrically coupled to the input terminal, and the second terminal of the first resistor is electrically coupled to the output terminal; a second resistor including a first terminal and a second terminal, wherein the first terminal of the second resistor is electrically coupled to the output terminal, and the second terminal of the second resistor is electrically coupled to a ground conductor; a Zener diode including a first terminal and a second terminal, wherein the first terminal of the Zener diode is electrically coupled to the input terminal; a third resistor including a first terminal and a second terminal, wherein the first terminal of the third resistor is electrically coupled to the second terminal of the Zener diode; a fourth resistor including a first terminal and a second terminal, wherein the first terminal of the fourth resistor is electrically coupled to the second terminal of the third resistor, and the second terminal of the fourth resistor is electrically coupled to the ground conductor; a fifth resistor including a first terminal and a second terminal, wherein the first terminal of the fifth resistor is electrically coupled to the input terminal; a first transistor including a first terminal, a second terminal, and a third terminal, wherein the first terminal of the first transistor is electrically coupled to the first terminal of the fourth resistor, the second terminal of the first transistor is electrically coupled to the second terminal of the fifth resistor, and the third terminal of the first transistor is electrically coupled to the ground conductor; and a second transistor including a first terminal, a second terminal, and a third terminal, wherein the first terminal of the second transistor is electrically coupled to the second terminal of the fifth resistor, the second terminal of the second transistor is electrically coupled to the ground conductor, and the third terminal of the second transistor is electrically coupled to the input terminal.

The first terminal of the Zener diode may be a cathode terminal of the Zener diode, and the second terminal of the Zener diode may be an anode terminal of the Zener diode.

Each of the first transistor and the second transistor may be a bipolar junction transistor.

The first transistor may be a Negative-Positive-Negative (NPN) bipolar junction transistor, and the second transistor may be a Positive-Negative-Positive (PNP) bipolar junction transistor. The first terminal of the first transistor may be a base terminal of the first transistor, the second terminal of the first transistor may be a collector terminal of the first transistor, the third terminal of the first transistor may be an emitter terminal of the first transistor, the first terminal of the second transistor may be a base terminal of the second transistor, the second terminal of the second transistor may be a collector terminal of the second transistor, and the third terminal of the second transistor is an emitter terminal of the second transistor.

The radiation tolerant discrete reference voltage source may further include a capacitor having a first terminal and a second terminal, wherein the first terminal of the capacitor is electrically coupled to the output terminal, and the second terminal of the capacitor is electrically coupled to the ground conductor.

A radiation tolerant discrete reference voltage source according to the present disclosure may be characterized as including: an input terminal which, in operation, inputs an input signal provided by an external voltage source; an output terminal which, in operation, outputs an output signal from the radiation tolerant discrete reference voltage source; a first resistor including a first terminal and a second terminal, wherein the first terminal of the first resistor is electrically coupled to the input terminal, and the second terminal of the first resistor is electrically coupled to the output terminal; a second resistor including a first terminal and a second terminal, wherein the first terminal of the second resistor is electrically coupled to the output terminal, and the second terminal of the second resistor is electrically coupled to a ground conductor; a Zener diode including a first terminal and a second terminal, wherein the first terminal of the Zener diode is electrically coupled to the input terminal; a third resistor including a first terminal and a second terminal, wherein the first terminal of the third resistor is electrically coupled to the second terminal of the Zener diode; a fourth resistor including a first terminal and a second terminal, wherein the first terminal of the fourth resistor is electrically coupled to the second terminal of the third resistor, and the second terminal of the fourth resistor is electrically coupled to the ground conductor; a fifth resistor including a first terminal and a second terminal, wherein the first terminal of the fifth resistor is electrically coupled to the input terminal; a first transistor including a first terminal, a second terminal, and a third terminal, wherein the first terminal of the first transistor is electrically coupled to the first terminal of the fourth resistor, the second terminal of the first transistor is electrically coupled to the second terminal of the fifth resistor, and the third terminal of the first transistor is electrically coupled to the ground conductor; a second transistor including a first terminal, a second terminal, and a third terminal, wherein the first terminal of the second transistor is electrically coupled to the second terminal of the fifth resistor, and the second terminal of the second transistor is electrically coupled to the ground conductor; a third transistor including a first terminal, a second terminal, and a third terminal, wherein the first terminal of the third transistor is electrically coupled to the third terminal of the second transistor, and the second terminal of the third transistor is electrically coupled to the ground conductor; and a fourth transistor including a first terminal, a second terminal, and a third terminal, wherein the first terminal of the fourth transistor is electrically coupled to the third terminal of the third transistor, the second terminal of the fourth transistor is electrically coupled to the ground conductor, and the third terminal of the second transistor is electrically coupled to the first terminal of the Zener diode.

The first terminal of the Zener diode may be a cathode terminal of the Zener diode, and the second terminal of the Zener diode may be an anode terminal of the Zener diode.

Each of the first transistor, the second transistor, the third transistor, and the fourth transistor may be a bipolar junction transistor.

The first transistor may be a Negative-Positive-Negative (NPN) bipolar junction transistor, and each of the second transistor, the third transistor, and the fourth transistor may be a Positive-Negative-Positive (PNP) bipolar junction transistor. The first terminal of the first transistor may be a base terminal of the first transistor, the second terminal of the first transistor may be a collector terminal of the first transistor, the third terminal of the first transistor may be an emitter terminal of the first transistor, the first terminal of the second transistor may be a base terminal of the second transistor, the second terminal of the second transistor may be a collector terminal of the second transistor, the third terminal of the second transistor may be an emitter terminal of the second transistor, the first terminal of the third transistor is a base terminal of the third transistor, the second terminal of the third transistor may be a collector terminal of the third transistor, the third terminal of the third transistor may be an emitter terminal of the third transistor, the first terminal of the fourth transistor may be a base terminal of the fourth transistor, the second terminal of the fourth transistor may be a collector terminal of the fourth transistor, and the third terminal of the fourth transistor may be an emitter terminal of the fourth transistor.

The radiation tolerant discrete reference voltage source may further include a capacitor having a first terminal and a second terminal, wherein the first terminal of the capacitor is electrically coupled to the output terminal, and the second terminal of the capacitor is electrically coupled to the ground conductor.

A method of providing a radiation tolerant discrete reference voltage source according to the present disclosure may be characterized as including: electrically coupling a first terminal of a first resistor is to an input terminal; electrically coupling a second terminal of the first resistor to an output terminal; electrically coupling a first terminal of a second resistor to the output terminal; electrically coupling a second terminal of the second resistor to a ground conductor; electrically coupling a first terminal of a Zener diode to the input terminal; electrically coupling a first terminal of a third resistor to a second terminal of the Zener diode; electrically coupling a first terminal of a fourth resistor to a second terminal of the third resistor; electrically coupling a second terminal of the fourth resistor to the ground conductor; electrically coupling a first terminal of a fifth resistor to the input terminal; electrically coupling a first terminal of a first transistor to the first terminal of the fourth resistor; electrically coupling a second terminal of the first transistor to a second terminal of the fifth resistor; electrically coupling a third terminal of the first transistor to the ground conductor; electrically coupling a first terminal of a second transistor to the second terminal of the fifth resistor; and electrically coupling a second terminal of the second transistor to the ground conductor.

The method may further include electrically coupling a third terminal of the second transistor to the first terminal of the Zener diode. The first transistor may be a Negative-Positive-Negative (NPN) bipolar junction transistor, and the second transistor may be a Positive-Negative-Positive (PNP) bipolar junction transistor. The first terminal of the Zener diode may be a cathode terminal of the Zener diode, the second terminal of the Zener diode may be an anode terminal of the Zener diode, the first terminal of the first transistor may be a base terminal of the first transistor, the second terminal of the first transistor may be a collector terminal of the first transistor, the third terminal of the first transistor may be an emitter terminal of the first transistor, the first terminal of the second transistor may be a base terminal of the second transistor, the second terminal of the second transistor may be a collector terminal of the second transistor, and the third terminal of the second transistor may be an emitter terminal of the second transistor.

The method may further include: electrically coupling a first terminal of a third transistor to a third terminal of the second transistor; electrically coupling a second terminal of the third transistor to the ground conductor; electrically coupling a first terminal of a fourth transistor to a third terminal of the third transistor; electrically coupling a second terminal of the fourth transistor to the ground conductor; and electrically coupling a third terminal of the fourth transistor to the first terminal of the Zener diode. The first transistor may be a Negative-Positive-Negative (NPN) bipolar junction transistor, and the second transistor may be a Positive-Negative-Positive (PNP) bipolar junction transistor. The first terminal of the Zener diode may be a cathode terminal of the Zener diode, the second terminal of the Zener diode may be an anode terminal of the Zener diode, the first terminal of the first transistor may be a base terminal of the first transistor, the second terminal of the first transistor may be a collector terminal of the first transistor, the third terminal of the first transistor may be an emitter terminal of the first transistor, the first terminal of the second transistor may be a base terminal of the second transistor, the second terminal of the second transistor is a collector terminal of the second transistor, the third terminal of the second transistor may be an emitter terminal of the second transistor, the first terminal of the third transistor may be a base terminal of the third transistor, the second terminal of the third transistor is a collector terminal of the third transistor, the third terminal of the third transistor may be an emitter terminal of the third transistor, the first terminal of the fourth transistor may be a base terminal of the fourth transistor, the second terminal of the fourth transistor may be a collector terminal of the fourth transistor, and the third terminal of the fourth transistor may be an emitter terminal of the fourth transistor.

The method may further include: forming the third resistor as a first film; forming the fourth resistor as a second film;

changing a resistance of the third resistor by trimming the first film; and changing a resistance of the fourth resistor by trimming the second film.

DETAILED DESCRIPTION

Figure 1A:
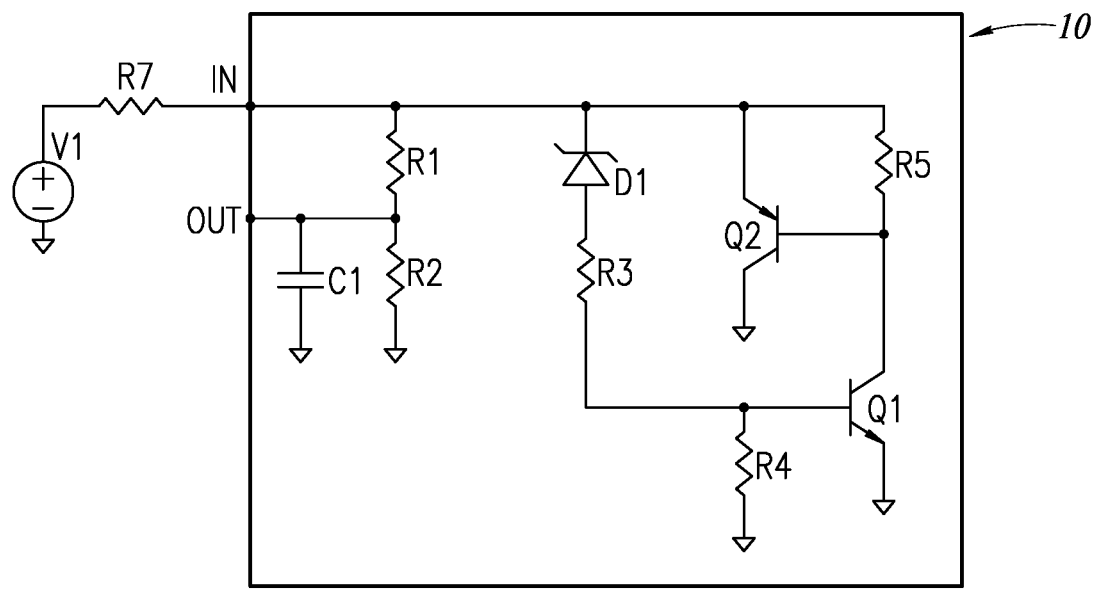
FIG. 1A shows a circuit diagram of a radiation tolerant discrete reference voltage source according to a first embodiment of the present disclosure.

FIG. 1A shows a circuit diagram of a radiation tolerant discrete reference voltage source 10 according to a first embodiment of the present disclosure. The reference voltage source 10 includes an input terminal IN, which is electrically coupled to an external voltage source V1 via an external resistor R7. Within the reference voltage source 10, the input terminal IN is electrically coupled to a first terminal of a resistor R1. A second terminal of the resistor R1 is electrically coupled to an output terminal OUT and a first terminal of a resistor R2 having a second terminal that is electrically coupled to a ground conductor at a reference potential. The resistors R1 and R2 form a voltage bridge that enables a voltage level at the output terminal OUT to be easily adjusted to a desired voltage level (e.g., 5.00V, 4.00V, 2.50V) by selecting appropriate values of the resistances of the resistors R1 and R2, which obviates a need to procure unique voltage references and provides significant design flexibility.

The input terminal IN is also electrically coupled to a cathode terminal of a Zener diode D1, an emitter terminal of a transistor Q2, and a first terminal of a resistor R5. An anode terminal of the Zener diode D1 is electrically coupled to a first terminal of a resistor R3. A second terminal of the resistor R3 is electrically coupled to a first terminal of a resistor R4 and a base terminal of a transistor Q1. A second terminal of the resistor R4 is electrically coupled to the ground conductor at the reference potential. A second terminal of the resistor R5 is electrically coupled to a base terminal of the transistor Q2 and a collector terminal of the transistor Q1. An emitter terminal of the transistor Q1 is electrically coupled to the ground conductor at the reference potential.

In one example implementation, the resistor R1 has a value of 17.45 kΩ, the resistor R2 has a value of 10 kΩ, the resistor R3 has a value of 620Ω, the resistor R4 has a value of 5 kΩ, the resistor R5 has a value of 9 kΩ, the Zener diode D1 is a UDZV6.2B Zener diode from ROHM Semiconductor, the transistor Q1 is a 2N3904 Negative-Positive-Negative (NPN) bipolar junction transistor from Motorola, and the transistor Q2 is a 2N3906 Positive-Negative-Positive (PNP) bipolar junction transistor from ON Semiconductor®.

Advantageously, the radiation tolerant discrete reference voltage source 10 provides improved control over radiation hardness and does not require any special high gain transistors. The discrete reference voltage source 10 has been tested to 300 krad(Si) at −55 C with less than 1% change in voltage.

In one implementation, the radiation tolerant discrete reference voltage source 10 is built on a sub-assembly using thick-film technology, and then modified to achieve desirable characteristics before the sub-assembly is installed on a main board. More particularly, the resistor R3 is formed as a first film and the resistor R4 is formed as a second film using thick-film technology. Subsequently, during a laser trimming process, a resistance of the resistor R3 and a resistance of the resistor R4 are changed by trimming the first film and the second film, respectively, using a laser, so that a desired voltage is present at the base terminal of the transistor Q1. Thus, a desired accuracy can be achieved before the radiation tolerant discrete reference voltage source 10 is installed on the main board. After the radiation tolerant discrete reference voltage source 10 is installed on the main board, the output terminal OUT is electrically coupled (e.g., using a wire and solder) to circuitry on the main board in order to provide a reference voltage to that circuitry via the output terminal OUT.

In one implementation, the Zener diode D1 becomes more resistive with increasing temperature (i.e., has a positive temperature coefficient), and the transistor Q1 becomes less resistive with increasing temperature (i.e., has a negative temperature coefficient). More particularly, in at least some implementations the Zener diode D1 has a 6.2V Zener voltage and its positive temperature coefficient is compensated by the negative temperature coefficient of the transistor Q1, which has a base-emitter voltage Vbe of 0.6V. The negative temperature coefficient of the transistor Q1 can be fine-tuned by changing the values of the resistances of the resistors R3 and R4, for example, by trimming the resistors R3 and R4, to cancel temperature effects and yield 6.8V between the cathode terminal of the Zener diode D1 and the ground conductor.

In addition, a soft-start capacitor C1 can be added at the output node OUT of the radiation tolerant discrete reference voltage source 10 to perform a soft-start function of the converter, similar to an integrated reference. For example, the soft-start capacitor includes a first terminal that is electrically coupled to the output terminal OUT, and a second terminal that is electrically coupled to the ground conductor at the reference potential.

Figure 1B:
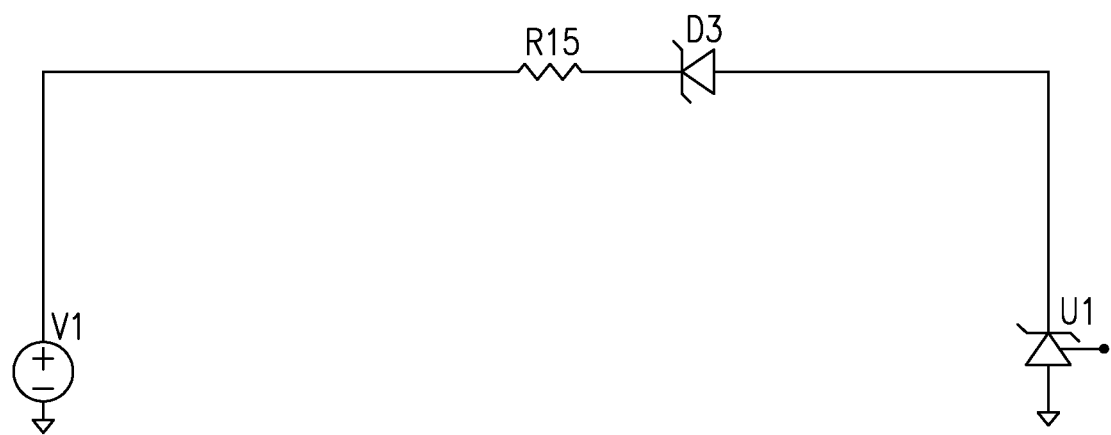
FIG. 1B shows a circuit diagram including a conventional radiation tolerant discrete reference voltage source.

FIG. 1B shows a circuit diagram including a conventional radiation tolerant integrated reference circuit U1, which is an LT1009 integrated reference circuit from Linear Technologies. The conventional radiation tolerant integrated reference circuit U1 is electrically coupled to the voltage source V1 via a Zener diode D3 and a resistor R15, as shown in FIG. 1B.

Figure 2A:
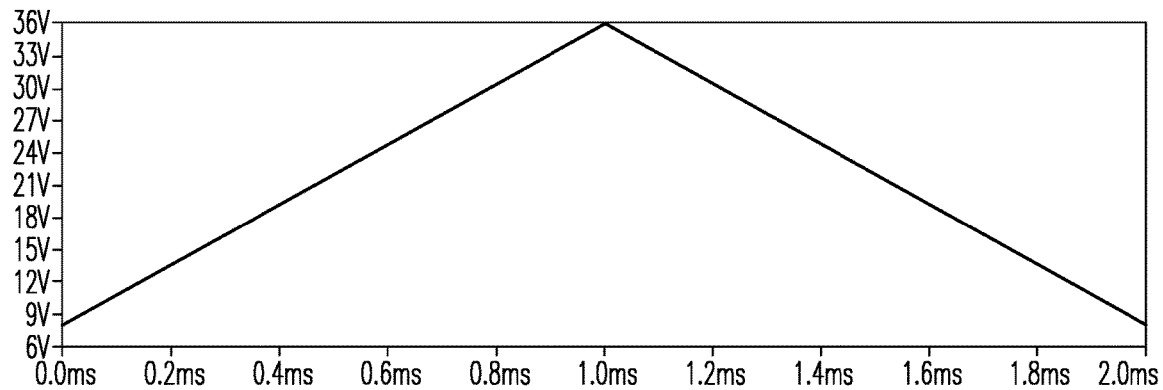
FIG. 2A shows a plot of a voltage supplied by a voltage source V1 shown in FIGS. 1A and 1B.

FIG. 2A shows a simulation plot of a signal that is output from the voltage source V1 shown in FIGS. 1A and 1B during a voltage sweep of the radiation tolerant discrete reference voltage source 10 and the conventional radiation tolerant integrated reference circuit U1. More particularly, the signal output from the voltage source V1 is provided to the input terminal IN of the radiation tolerant discrete reference voltage source 10 via the resistor R7, and provided to an input terminal of the conventional radiation tolerant integrated reference circuit U1 via the resistor R15 and the Zener diode D3. The vertical axis of FIG. 2A represents voltage in volts (V), and the illustrated range is from 8V to 36V. The horizontal axis of FIG. 2A represents time in milliseconds (ms), and the illustrated range is from 0ms to 2.0 ms. As shown in FIG. 2A, the input signal linearly increases from 8 to 36 volts for one millisecond, and then linearly decreases from 36 back to 8 volts for one millisecond.

Figure 2B:
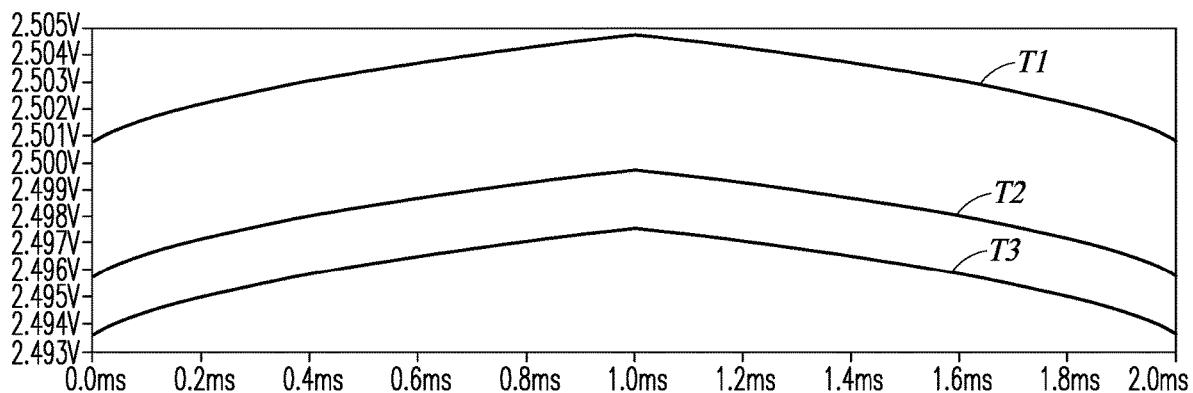
FIG. 2B shows simulation plots of voltage reference signals output from the conventional radiation tolerant discrete reference voltage source shown in FIG. 1B at different temperatures, in response to the input signal shown in FIG. 2A.

FIG. 2B shows simulation plots of voltage reference signals output from an output terminal of the conventional radiation tolerant integrated reference circuit U1 at different temperatures T1, T2, and T3, in response to the input signal shown in FIG. 2A. The vertical axis of FIG. 2B represents voltage in volts (V), and the illustrated range is from 2.493V to 2.505V. The horizontal axis of FIG. 2B represents time in milliseconds (ms), and the illustrated range is from 0ms to 2.0 ms.

Figure 2C:
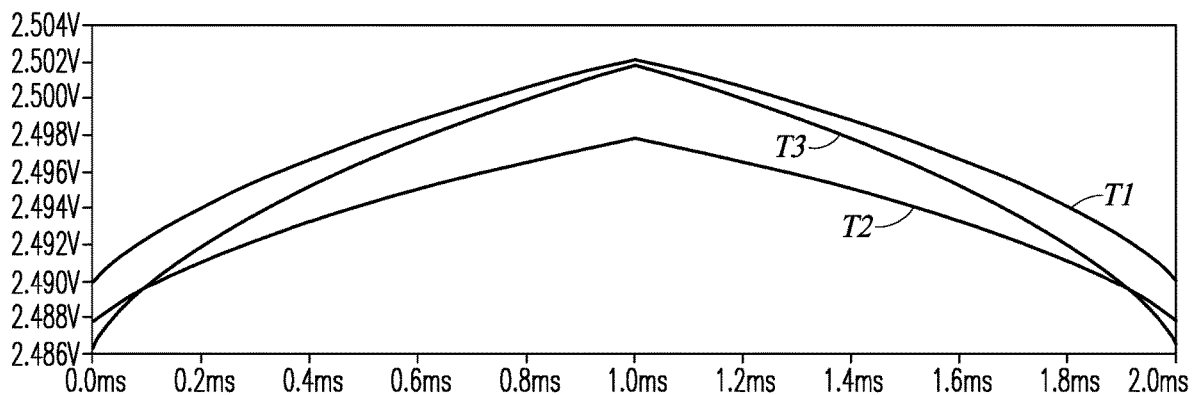
FIG. 2C shows simulation plots of voltage reference signals output from the radiation tolerant discrete reference voltage source shown in FIG. 1A at different temperatures, in response to the input signal shown in FIG. 2A.

FIG. 2C shows simulation plots of voltage reference signals output from the output terminal OUT of the radiation tolerant discrete reference voltage source 10 shown in FIG. 1A at the different temperatures T1, T2, and T3, in response to the input signal shown in FIG. 2A. The vertical axis of FIG. 2C represents voltage in volts (V), and the illustrated range is from 2.486V to 2.504V. The horizontal axis of FIG. 2C represents time in milliseconds (ms), and the illustrated range is from 0ms to 2.0 ms.

As can be seen by comparing FIGS. 2B and 2C, the performance and temperature coefficient of the radiation tolerant discrete reference voltage source 10 shown in FIG. 1A is as good as the conventional radiation tolerant integrated reference circuit U1 shown in FIG. 1B. The radiation tolerant discrete reference voltage source 10 according to the present disclosure advantageously includes relatively few components that cost about 10% of the cost of the conventional radiation tolerant integrated reference circuit U1.

Figure 3A:
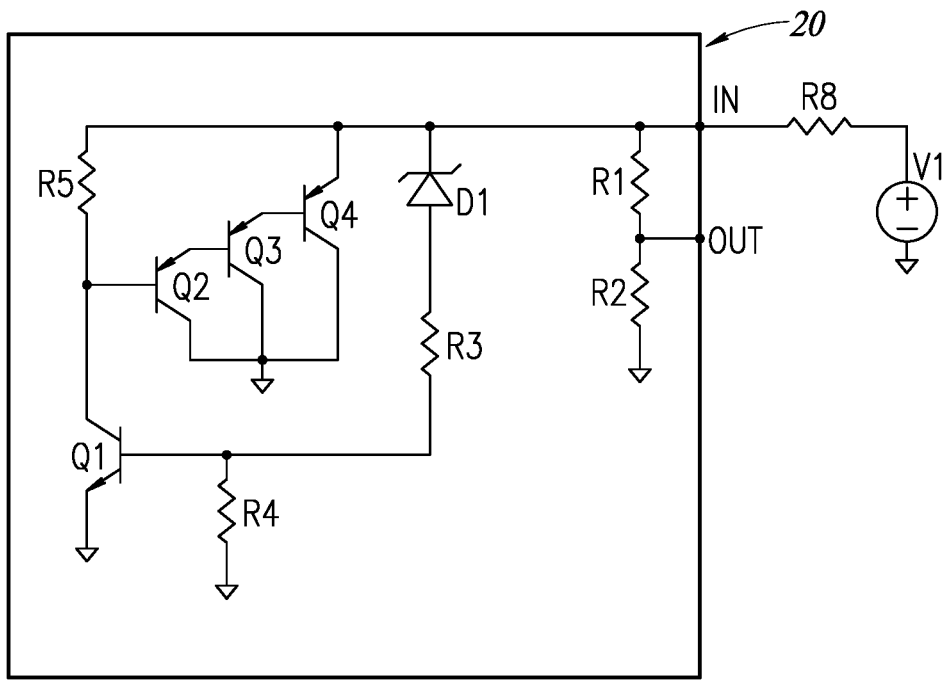
FIG. 3A shows a circuit diagram of a radiation tolerant discrete reference voltage source according to a second embodiment of the present disclosure.

FIG. 3A shows a circuit diagram of a radiation tolerant discrete reference voltage source 20 according to a second embodiment of the present disclosure. The radiation tolerant discrete reference voltage source 20 is similar in many relevant respects to the radiation tolerant discrete reference voltage source 10 shown in FIG. 1A, except that instead of using a single PNP bipolar junction transistor Q2, the radiation tolerant discrete reference voltage source 20 uses three PNP bipolar junction transistors Q2, Q3, and Q4 that are cascaded to improve line rejection.

The radiation tolerant discrete reference voltage source 20 includes an input terminal IN, which is electrically coupled to the external voltage source V1 via an external resistor R8. Within the reference voltage source 20, the input terminal IN is electrically coupled to a first terminal of a resistor R1. A second terminal of the resistor R1 is electrically coupled to an output terminal OUT and a first terminal of a resistor R2 having a second terminal that is electrically coupled to a ground conductor at a reference potential. The resistors R1 and R2 form a voltage bridge that enables a voltage level at the output terminal OUT to be easily adjusted to a desired voltage level (e.g., 5.00V, 4.00V, 2.50V) by selecting appropriate values of the resistors R1 and R2, which obviates a need to procure unique voltage references and provides design flexibility.

The input terminal also is electrically coupled to a cathode terminal of a Zener diode D1, an emitter terminal of a transistor Q4, and a first terminal of a resistor R5. An anode terminal of the Zener diode D1 is electrically coupled to a first terminal of a resistor R3. A second terminal of the resistor R3 is electrically coupled to a first terminal of a resistor R4 and a base terminal of a transistor Q1. A second terminal of the resistor R4 is electrically coupled to the ground conductor at the reference potential. The emitter terminal of the transistor Q1 is electrically coupled to the ground conductor at the reference potential. A collector terminal of the transistor Q1 is electrically coupled to a second terminal of the resistor R5 and a base terminal of a transistor Q2. The emitter terminal of the transistor Q2 is electrically coupled to a base terminal of a transistor Q3. The emitter terminal of the transistor Q3 is electrically coupled to a base terminal of the transistor Q4. Collector terminals of the transistors Q2, Q3, and Q4 are electrically coupled to the ground conductor at the reference potential.

In one example implementation, the resistor R1 has a value of 17.4 kΩ, the resistor R2 has a value of 10 kΩ, the resistor R3 has a value of 1.2 kΩ, the resistor R4 has a value of 10 kΩ, the resistor R5 has a value of 10 kΩ, the Zener diode D1 is a UDZV6.4B Zener diode from ROHM Semiconductor, the transistor Q1 is a 2N3904 Negative-Positive-Negative (NPN) bipolar junction transistor from Motorola, and the transistors Q2, Q3, and Q4 are each a 2N3906 Positive-Negative-Positive (PNP) bipolar junction transistor from ON Semiconductor®.

Figure 3B:
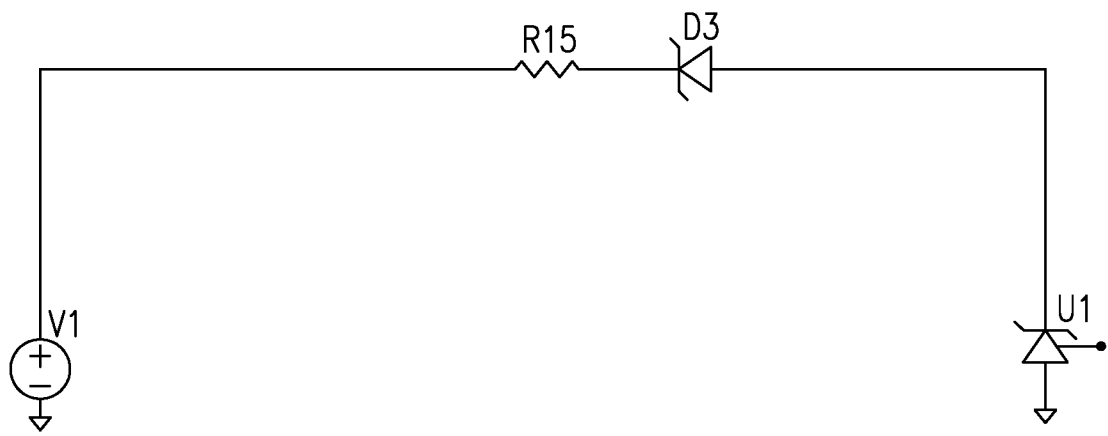
FIG. 3B shows a circuit diagram including a conventional radiation tolerant discrete reference voltage source.

FIG. 3B shows a circuit diagram including the conventional radiation tolerant integrated reference circuit U1, which is an LT1009 integrated reference circuit from Linear Technologies. The conventional radiation tolerant integrated reference circuit U1 is electrically coupled to the voltage source V1 via the Zener diode D3 and the resistor R15, as shown in FIG. 3B.

Figure 4A:
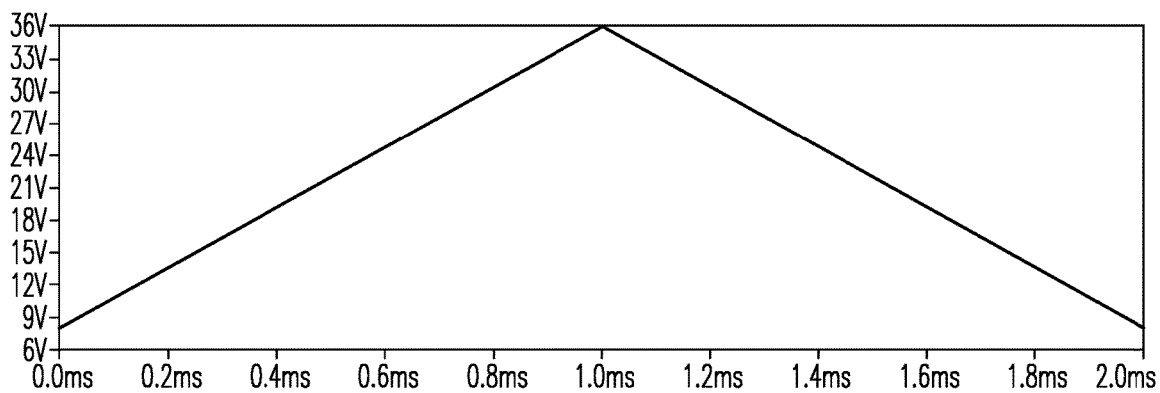
FIG. 4A shows a plot of a voltage supplied by a voltage source V1 shown in FIGS. 3A and 3B.

FIG. 4A shows a simulation plot of a signal that is output from the voltage source V1 shown in FIGS. 3A and 3B during a voltage sweep of the radiation tolerant discrete reference voltage source 20 and the conventional radiation tolerant integrated reference circuit U1. More particularly, the signal output from the voltage source V1 is provided to the input terminal IN of the radiation tolerant discrete reference voltage source 20 via the resistor R8, and provided to an input terminal of the conventional radiation tolerant integrated reference circuit U1 via the resistor R15 and the Zener diode D3. The vertical axis of FIG. 4A represents voltage in volts (V), and the illustrated range is from 8V to 36V. The horizontal axis of FIG. 4A represents time in milliseconds (ms), and the illustrated range is from 0ms to 2.0 ms. As shown in FIG. 4A, the input signal linearly increases from 8 to 36 volts for one millisecond, and then linearly decreases from 36 back to 8 volts for one millisecond.

Figure 4B:
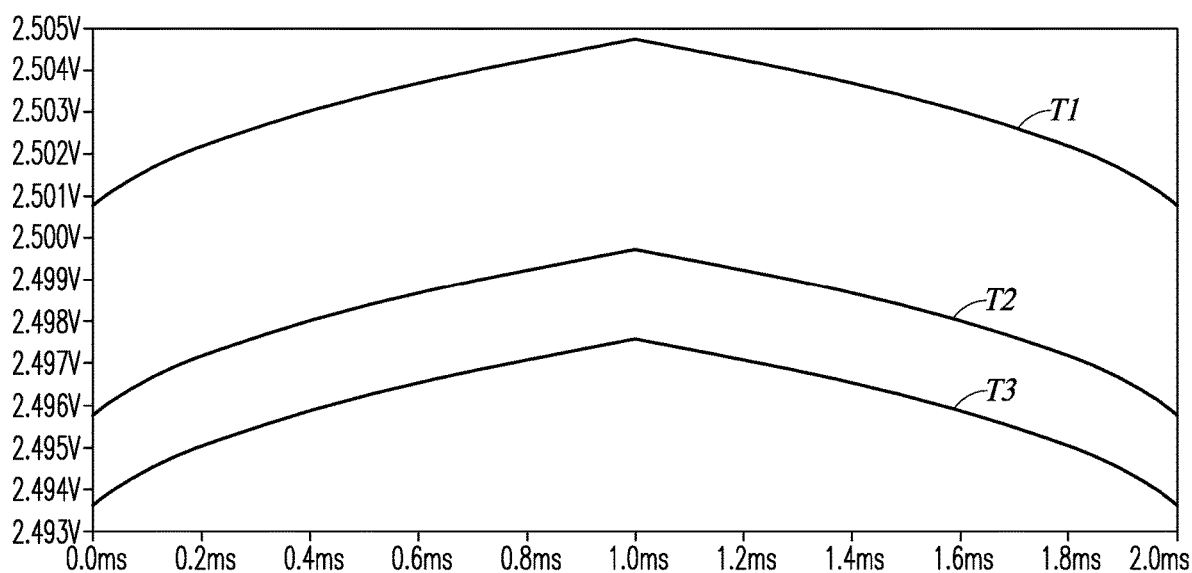
FIG. 4B shows simulation plots of voltage reference signals output from the conventional radiation tolerant discrete reference voltage source shown in FIG. 3B at different temperatures, in response to the input signal shown in FIG. 4A.

FIG. 4B shows simulation plots of voltage reference signals output from an output terminal of the conventional radiation tolerant integrated reference circuit U1 at different temperatures T1, T2, and T3 in response to the input signal shown in FIG. 4A. The vertical axis of FIG. 4B represents voltage in volts (V), and the illustrated range is from 2.493V to 2.505V. The horizontal axis of FIG. 4B represents time in milliseconds (ms), and the illustrated range is from 0ms to 2.0 ms.

Figure 4C:
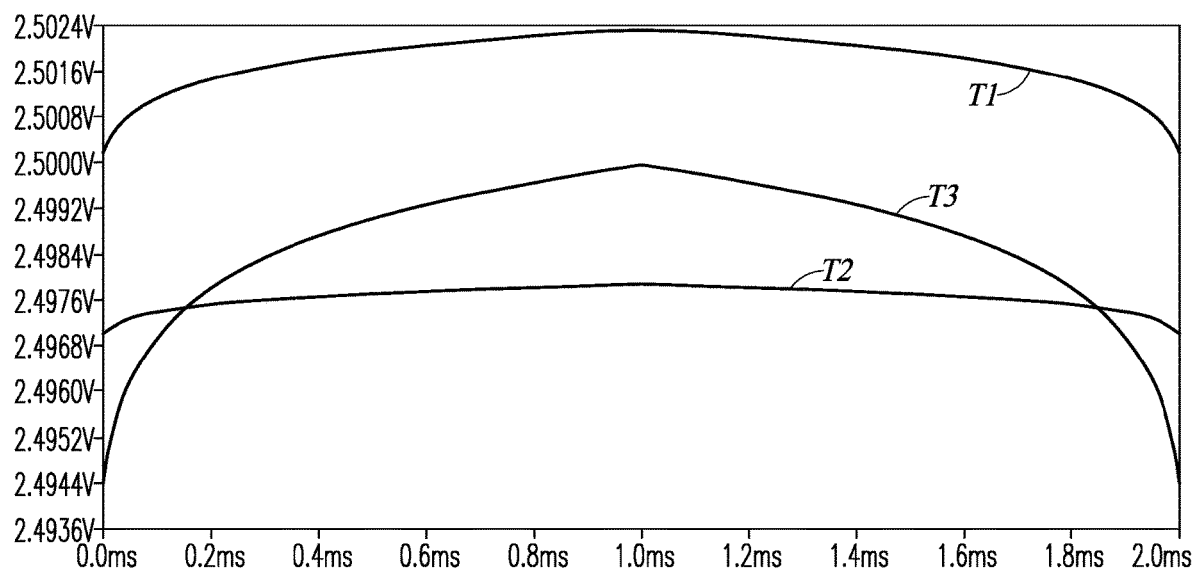
FIG. 4C shows simulation plots of voltage reference signals output at different temperatures from the radiation tolerant discrete reference voltage source shown in FIG. 3A at different temperatures, in response to the input signal shown in FIG. 4A.

FIG. 4C shows simulation plots of voltage reference signals output from the output terminal OUT of the radiation tolerant discrete reference voltage source 20 shown in FIG. 3A at the different temperatures T1, T2, and T3, in response to the input signal shown in FIG. 4A. The vertical axis of FIG. 4C represents voltage in volts (V), and the illustrated range is from 2.4936V to 2.5024V. The horizontal axis of FIG. 4C represents time in milliseconds (ms), and the illustrated range is from 0ms to 2.0 ms.

As can be seen by comparing FIGS. 4B and 4C, the performance and temperature coefficient of the radiation tolerant discrete reference voltage source 20 shown in FIG. 3A is as good as the conventional radiation tolerant integrated reference circuit U1 shown in FIG. 3B, and in some cases even better. The radiation tolerant discrete reference voltage source 20 according to the present disclosure advantageously includes relatively few components that cost about 10% of the cost of the conventional radiation tolerant integrated reference circuit U1.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A radiation tolerant discrete reference voltage source, comprising:
   an input terminal which, in operation, inputs an input signal provided by an external voltage source;
   an output terminal which, in operation, outputs an output signal from the radiation tolerant discrete reference voltage source;
   a first resistor including a first terminal and a second terminal, wherein the first terminal of the first resistor is electrically coupled to the input terminal, and the second terminal of the first resistor is electrically coupled to the output terminal;
   a second resistor including a first terminal and a second terminal, wherein the first terminal of the second resistor is electrically coupled to the output terminal, and the second terminal of the second resistor is electrically coupled to a ground conductor;
   a Zener diode including a first terminal and a second terminal, wherein the first terminal of the Zener diode is electrically coupled to the input terminal;
   a third resistor including a first terminal and a second terminal, wherein the first terminal of the third resistor is electrically coupled to the second terminal of the Zener diode;
   a fourth resistor including a first terminal and a second terminal, wherein the first terminal of the fourth resistor is electrically coupled to the second terminal of the third resistor, and the second terminal of the fourth resistor is electrically coupled to the ground conductor;
   a fifth resistor including a first terminal and a second terminal, wherein the first terminal of the fifth resistor is electrically coupled to the input terminal;
   a first transistor including a first terminal, a second terminal, and a third terminal, wherein the first terminal of the first transistor is electrically coupled to the first terminal of the fourth resistor, the second terminal of the first transistor is electrically coupled to the second terminal of the fifth resistor, and the third terminal of the first transistor is electrically coupled to the ground conductor; and
   a second transistor including a first terminal, a second terminal, and a third terminal, wherein the first terminal of the second transistor is electrically coupled to the second terminal of the fifth resistor, the second terminal of the second transistor is electrically coupled to the ground conductor, and the third terminal of the second transistor is electrically coupled to the input terminal.

2. The radiation tolerant discrete reference voltage source according to claim 1, wherein:
   the first terminal of the Zener diode is a cathode terminal of the Zener diode, and
   the second terminal of the Zener diode is an anode terminal of the Zener diode.

3. The radiation tolerant discrete reference voltage source according to claim 1, wherein each of the first transistor and the second transistor is a bipolar junction transistor.

4. The radiation tolerant discrete reference voltage source according to claim 1, wherein:
   the first transistor is a Negative-Positive-Negative (NPN) bipolar junction transistor, and
   the second transistor is a Positive-Negative-Positive (PNP) bipolar junction transistor.

5. The radiation tolerant discrete reference voltage source according to claim 4, wherein:
   the first terminal of the first transistor is a base terminal of the first transistor,
   the second terminal of the first transistor is a collector terminal of the first transistor,
   the third terminal of the first transistor is an emitter terminal of the first transistor,
   the first terminal of the second transistor is a base terminal of the second transistor,
   the second terminal of the second transistor is a collector terminal of the second transistor, and
   the third terminal of the second transistor is an emitter terminal of the second transistor.

6. The radiation tolerant discrete reference voltage source according to claim 1, further comprising:
   a capacitor having a first terminal and a second terminal, wherein the first terminal of the capacitor is electrically coupled to the output terminal, and the second terminal of the capacitor is electrically coupled to the ground conductor.

7. A radiation tolerant discrete reference voltage source, comprising:
   an input terminal which, in operation, inputs an input signal provided by an external voltage source;
   an output terminal which, in operation, outputs an output signal from the radiation tolerant discrete reference voltage source;

a first resistor including a first terminal and a second terminal, wherein the first terminal of the first resistor is electrically coupled to the input terminal, and the second terminal of the first resistor is electrically coupled to the output terminal;

a second resistor including a first terminal and a second terminal, wherein the first terminal of the second resistor is electrically coupled to the output terminal, and the second terminal of the second resistor is electrically coupled to a ground conductor;

a Zener diode including a first terminal and a second terminal, wherein the first terminal of the Zener diode is electrically coupled to the input terminal;

a third resistor including a first terminal and a second terminal, wherein the first terminal of the third resistor is electrically coupled to the second terminal of the Zener diode;

a fourth resistor including a first terminal and a second terminal, wherein the first terminal of the fourth resistor is electrically coupled to the second terminal of the third resistor, and the second terminal of the fourth resistor is electrically coupled to the ground conductor;

a fifth resistor including a first terminal and a second terminal, wherein the first terminal of the fifth resistor is electrically coupled to the input terminal;

a first transistor including a first terminal, a second terminal, and a third terminal, wherein the first terminal of the first transistor is electrically coupled to the first terminal of the fourth resistor, the second terminal of the first transistor is electrically coupled to the second terminal of the fifth resistor, and the third terminal of the first transistor is electrically coupled to the ground conductor;

a second transistor including a first terminal, a second terminal, and a third terminal, wherein the first terminal of the second transistor is electrically coupled to the second terminal of the fifth resistor, and the second terminal of the second transistor is electrically coupled to the ground conductor;

a third transistor including a first terminal, a second terminal, and a third terminal, wherein the first terminal of the third transistor is electrically coupled to the third terminal of the second transistor, and the second terminal of the third transistor is electrically coupled to the ground conductor; and a fourth transistor including a first terminal, a second terminal, and a third terminal, wherein the first terminal of the fourth transistor is electrically coupled to the third terminal of the third transistor, the second terminal of the fourth transistor is electrically coupled to the ground conductor, and the third terminal of the second transistor is electrically coupled to the first terminal of the Zener diode.

8. The radiation tolerant discrete reference voltage source according to claim 7, wherein:

the first terminal of the Zener diode is a cathode terminal of the Zener diode, and the second terminal of the Zener diode is an anode terminal of the Zener diode.

9. The radiation tolerant discrete reference voltage source according to claim 7, wherein each of the first transistor, the second transistor, the third transistor, and the fourth transistor is a bipolar junction transistor.

10. The radiation tolerant discrete reference voltage source according to claim 7, wherein:

the first transistor is a Negative-Positive-Negative (NPN) bipolar junction transistor, and each of the second transistor, the third transistor, and the fourth transistor is a Positive-Negative-Positive (PNP) bipolar junction transistor.

11. The radiation tolerant discrete reference voltage source according to claim 10, wherein:

the first terminal of the first transistor is a base terminal of the first transistor, the second terminal of the first transistor is a collector terminal of the first transistor, the third terminal of the first transistor is an emitter terminal of the first transistor, the first terminal of the second transistor is a base terminal of the second transistor, the second terminal of the second transistor is a collector terminal of the second transistor, the third terminal of the second transistor is an emitter terminal of the second transistor, the first terminal of the third transistor is a base terminal of the third transistor, the second terminal of the third transistor is a collector terminal of the third transistor, the third terminal of the third transistor is an emitter terminal of the third transistor, the first terminal of the fourth transistor is a base terminal of the fourth transistor, the second terminal of the fourth transistor is a collector terminal of the fourth transistor, and the third terminal of the fourth transistor is an emitter terminal of the fourth transistor.

12. The radiation tolerant discrete reference voltage source according to claim 7, further comprising:

a capacitor having a first terminal and a second terminal, wherein the first terminal of the capacitor is electrically coupled to the output terminal, and the second terminal of the capacitor is electrically coupled to the ground conductor.

13. A method of providing a radiation tolerant discrete reference voltage source, the method comprising:

electrically coupling a first terminal of a first resistor is to an input terminal;

electrically coupling a second terminal of the first resistor to an output terminal;

electrically coupling a first terminal of a second resistor to the output terminal;

electrically coupling a second terminal of the second resistor to a ground conductor;

electrically coupling a first terminal of a Zener diode to the input terminal;

electrically coupling a first terminal of a third resistor to a second terminal of the Zener diode;

electrically coupling a first terminal of a fourth resistor to a second terminal of the third resistor;

electrically coupling a second terminal of the fourth resistor to the ground conductor;

electrically coupling a first terminal of a fifth resistor to the input terminal;

electrically coupling a first terminal of a first transistor to the first terminal of the fourth resistor;

electrically coupling a second terminal of the first transistor to a second terminal of the fifth resistor;

electrically coupling a third terminal of the first transistor to the ground conductor;

electrically coupling a first terminal of a second transistor to the second terminal of the fifth resistor; and electrically coupling a second terminal of the second transistor to the ground conductor.

14. The method according to claim 13, further comprising:
  electrically coupling a third terminal of the second transistor to the first terminal of the Zener diode.
15. The method according to claim 14, wherein:
the first transistor is a Negative-Positive-Negative (NPN) bipolar junction transistor, and
the second transistor is a Positive-Negative-Positive (PNP) bipolar junction transistor.
16. The method according to claim 15, wherein:
the first terminal of the Zener diode is a cathode terminal of the Zener diode,
the second terminal of the Zener diode is an anode terminal of the Zener diode,
the first terminal of the first transistor is a base terminal of the first transistor,
the second terminal of the first transistor is a collector terminal of the first transistor,
the third terminal of the first transistor is an emitter terminal of the first transistor,
the first terminal of the second transistor is a base terminal of the second transistor,
the second terminal of the second transistor is a collector terminal of the second transistor, and
the third terminal of the second transistor is an emitter terminal of the second transistor.
17. The method according to claim 13, further comprising:
  electrically coupling a first terminal of a third transistor to a third terminal of the second transistor;
  electrically coupling a second terminal of the third transistor to the ground conductor;
  electrically coupling a first terminal of a fourth transistor to a third terminal of the third transistor;
  electrically coupling a second terminal of the fourth transistor to the ground conductor; and
  electrically coupling a third terminal of the fourth transistor to the first terminal of the Zener diode.
18. The method according to claim 17, wherein:
the first transistor is a Negative-Positive-Negative (NPN) bipolar junction transistor, and
the second transistor is a Positive-Negative-Positive (PNP) bipolar junction transistor.
19. The method according to claim 18, wherein:
the first terminal of the Zener diode is a cathode terminal of the Zener diode,
the second terminal of the Zener diode is an anode terminal of the Zener diode,
the first terminal of the first transistor is a base terminal of the first transistor,
the second terminal of the first transistor is a collector terminal of the first transistor,
the third terminal of the first transistor is an emitter terminal of the first transistor,
the first terminal of the second transistor is a base terminal of the second transistor,
the second terminal of the second transistor is a collector terminal of the second transistor,
the third terminal of the second transistor is an emitter terminal of the second transistor,
the first terminal of the third transistor is a base terminal of the third transistor,
the second terminal of the third transistor is a collector terminal of the third transistor,
the third terminal of the third transistor is an emitter terminal of the third transistor,
the first terminal of the fourth transistor is a base terminal of the fourth transistor,
the second terminal of the fourth transistor is a collector terminal of the fourth transistor, and
the third terminal of the fourth transistor is an emitter terminal of the fourth transistor.
20. The method according to claim 13, further comprising:
  forming the third resistor as a first film;
  forming the fourth resistor as a second film;
  changing a resistance of the third resistor by trimming the first film; and
  changing a resistance of the fourth resistor by trimming the second film.

* * * * *